United States Patent
Andrews et al.

[11] Patent Number: 6,020,755
[45] Date of Patent: Feb. 1, 2000

[54] HYBRID PROGRAMMABLE GATE ARRAYS

[75] Inventors: William B. Andrews, Long Pond; Barry K. Britton, Orefield; Thomas J. Hickey, Wescoesville; Ronald T. Modo, Emmaus; Ho T. Nguyen, Allentown; Lorraine L. Schadt, Bethlehem; Satwant Singh, Macungie, all of Pa.

[73] Assignee: Lucent Technologies Inc., Murray Hill, N.J.

[21] Appl. No.: 08/938,550

[22] Filed: Sep. 26, 1997

[51] Int. Cl.[7] .................................................. H03K 19/177
[52] U.S. Cl. ................................................. 326/39; 326/41
[58] Field of Search ................................. 326/37–41, 47

[56] References Cited

U.S. PATENT DOCUMENTS

| | | | |
|---|---|---|---|
| 5,311,080 | 5/1994 | Britton et al. | |
| 5,376,844 | 12/1994 | Pedersen et al. | 326/39 |
| 5,821,776 | 10/1998 | McGowan | 326/41 |
| 5,825,202 | 10/1998 | Tavana et al. | 326/39 |
| 5,874,834 | 2/1999 | New | 326/40 |

*Primary Examiner*—Jon Santamauro

[57] ABSTRACT

A single integrated circuit (IC) having one or more regions of mask-programmed device (MPD) logic for implementing permanent functions and one or more regions of field-programmable gate-array (FPGA) logic for implementing user-specified functions. The FPGA-type logic provides programming flexibility, while the MPD-type logic provides size, speed, functionality, and dollar cost advantages. In one embodiment, a hybrid IC has an array of programmable logic cells (PLCs) implemented using FPGA-type logic, an application-specific block (ASB) implemented using MPD-type logic, and a ring of pads. Fast interface switch hierarchy (FISH) cells provide the interface between the PLC array and the pads, between the PLC array and the ASB, and between the ASB and the pad ring. Muxes in the FISH cells can be programmed to cause the FISH cells to operate either (1) as programmable interface cells (PICs) that provide a direct interface between the PLC array and the pad ring or (2) as ASB-interface cells (AICs) that (a) provide interfaces between the PLC array and the ASB and (b) control interfaces between the ASB and the pad ring.

10 Claims, 4 Drawing Sheets

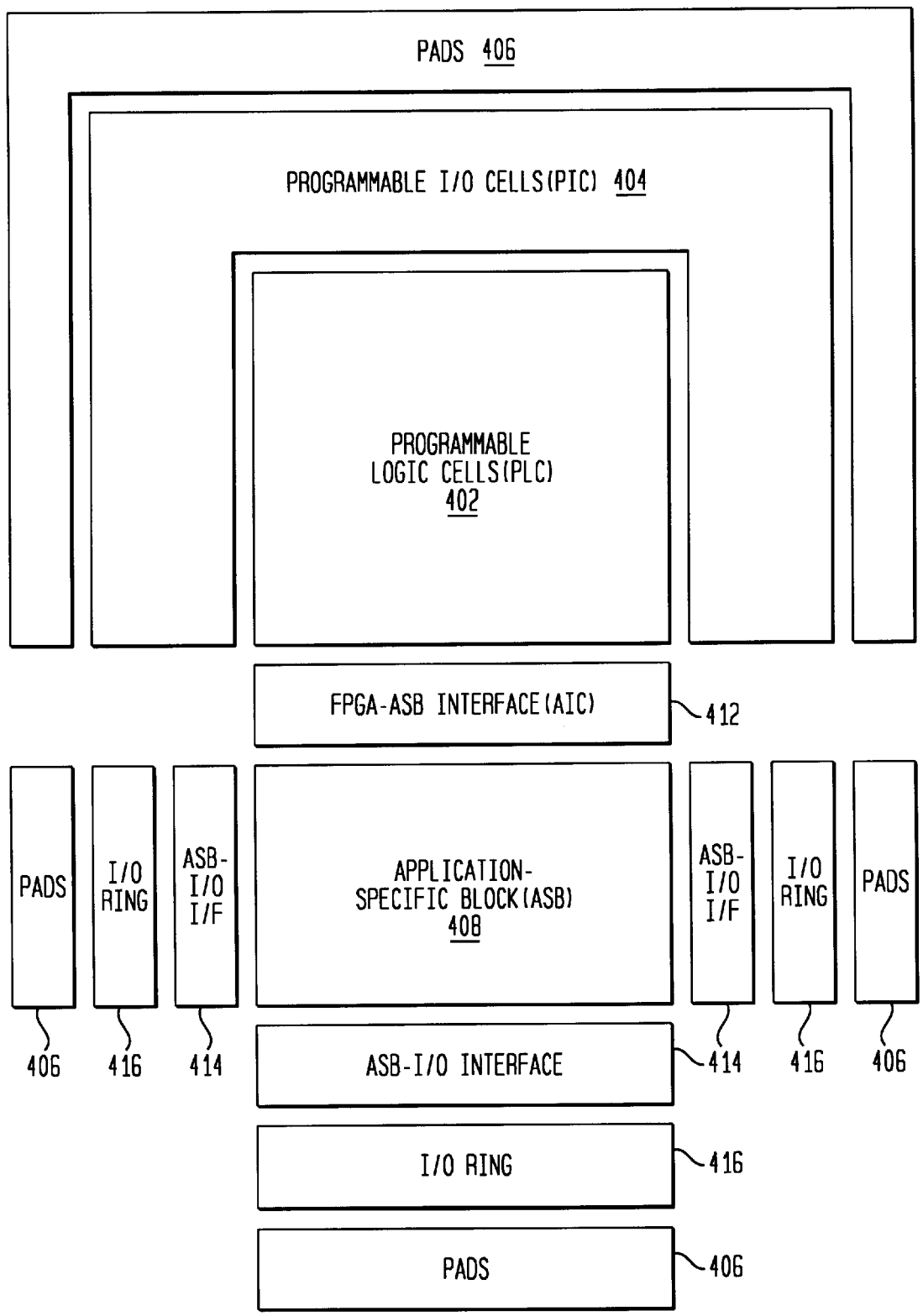

_6,020,755_

HYBRID PROGRAMMABLE GATE ARRAYS

BACKGROUND OF THE INVENTION

1. Field of the Invention

The present invention relates to integrated circuits, and, in particular, to programmable gate arrays and application-specific integrated circuits.

2. Description of the Related Art

Programmable gate arrays constitute one family of integrated circuits. There are different types of programmable gate arrays. A mask-programmable gate array (MPGA) (also known as a factory-programmable gate array) is a type of mask-programmed integrated circuit that is programmed one time and typically by the manufacturer of the gate array. Other types of mask-programmed devices (MPDs) include full-custom devices and standard-cell devices. A field-programmable gate array (FPGA), on the other hand, is a type of gate-array integrated circuit that can be programmed by the user. An FPGA can be one-time programmable or re-programmable, in which case the user can re-program the gate array one or more times.

FIG. 1 shows a schematic diagram of a conventional FPGA 100, having an array 102 of programmable logic cells (PLCs) surrounded by a ring 104 of programmable input/output (I/O) cells (PICs) and an outermost ring 106 of pads. The PLCs and PICs can be programmed (and possibly reprogrammed) in the field to implement a desired set of functions. This programming is typically done through the configuration interface of the FPGA, which reads a stream of bits and writes to the internal configuration storage (SRAM, EEPROM, anti-fuse, etc.), which in turn controls the programmable logic and routing. The PICs operate as the interfaces between the array of PLCs and individual pads, which provide connections to the "outside world," that is, circuitry external to the FPGA. Programmable general routing resources (not shown in FIG. 1) are used to implement specific connections between PLC array 102 and PIC ring 104 (i.e., PLC-PIC connections) as well as specific connections within PLC array 102 (i.e., PLC-PLC connections) and within PIC ring 104 (i.e., PIC-PIC connections).

FIG. 2 shows a detail of a portion of FPGA 100 of FIG. 1. According to one conventional design, each PIC in ring 104 is associated with four pads and has four corresponding sets of pad logic. FIG. 2 shows a schematic diagram of the circuitry of FPGA 100 that is associated with one of these sets of pad logic. PLC logic 202 and PLC local routing 204 are part of PLC array 102 of FIG. 1. Similarly, PIC local routing 208 and PIC logic 210 are part of PIC ring 104 of FIG. 1, while pad 212 is one of the pads of pad ring 106 of FIG. 1. General routing resources 206 correspond to the programmable routing and logic used to connect individual sets of PLC logic to individual sets of PIC logic. PIC logic 210 comprises an output buffer 216 and an input buffer 218, as well as boundary scan and other miscellaneous PIC logic 214, such as optional flip-flops and latches.

FIG. 3 shows a schematic diagram of one of the three main types of mask-programmed devices—a conventional MPGA 300, having an array of gates 302 surrounded by a ring of pads 306. Typically, the array of gates and the ring of pads are interconnected with each other by conductive (typically metal) wires to implement a desired set of functions. The ring of pads serves the same purpose of interfacing to the "outside world" as the ring of pads in FPGA 100 of FIG. 1. In a typical MPGA, the array of gates and the array of pads are pre-defined and the user can only define how they are interconnected at the factory. The other two main types of MPDs are standard-cell devices, which have rows of standard cells instead of an array of gates, and full-custom devices, which have individual transistors instead of an array of gates. These two types of devices also differ from MPGAs in that the rows of standard cells and the arrays of transistors are not pre-fixed, thus allowing increased functionality.

An FPGA, such as FPGA 100 of FIG. 1, has the flexibility to implement many different logic functions using the same silicon, although the cost of this flexibility is in chip layout area, performance (i.e., speed and power dissipation), and dollar cost. An MPGA could be designed to implement the same piece of logic with less area and optimal performance, translating into a lower dollar cost. The cost of using an MPGA, however, is that, once it is manufactured, the logic function cannot be changed by the user.

The present invention is directed to a scheme for exploiting both the programming flexibility advantages of FPGAs and the size, speed, functionality, and dollar cost advantages of MPDs.

SUMMARY OF THE INVENTION

In general, the present invention is directed to a single hybrid integrated circuit (IC) having one or more regions of MPD-type logic for implementing permanent functions and one or more regions of FPGA-type logic for implementing user-specified functions. The FPGA-type logic provides programming flexibility, while the MPD-type logic provides size, speed, functionality, and dollar cost advantages. In one embodiment, a hybrid IC has an array of programmable logic cells (PLCs) implemented using FPGA-type logic, an application-specific block (ASB) implemented using MPD-type logic, and a ring of pads. Fast interface switch hierarchy (FISH) cells provide the interface between the PLC array and the ASB. Muxes in the FISH cells can be programmed to cause the FISH cells to operate either (1) as programmable interface cells (PICs) that provide a direct interface between the PLC array and the pad ring or (2) as ASB-interface cells (AICs) that provide interfaces between the PLC array and the ASB.

Another aspect of the invention is the ability to program the FPGA portion of the hybrid device separate from the ASB portion. The invention also includes the ability to modify the logic functionality in the ASB portion by setting options in the FPGA portion.

BRIEF DESCRIPTION OF THE DRAWINGS

Other aspects, features, and advantages of the present invention will become more fully apparent from the following detailed description, the appended claims, and the accompanying drawings in which:

FIG. 4 shows a schematic diagram of a hybrid integrated circuit, according to one embodiment of the present invention.

DETAILED DESCRIPTION

Figure 1:
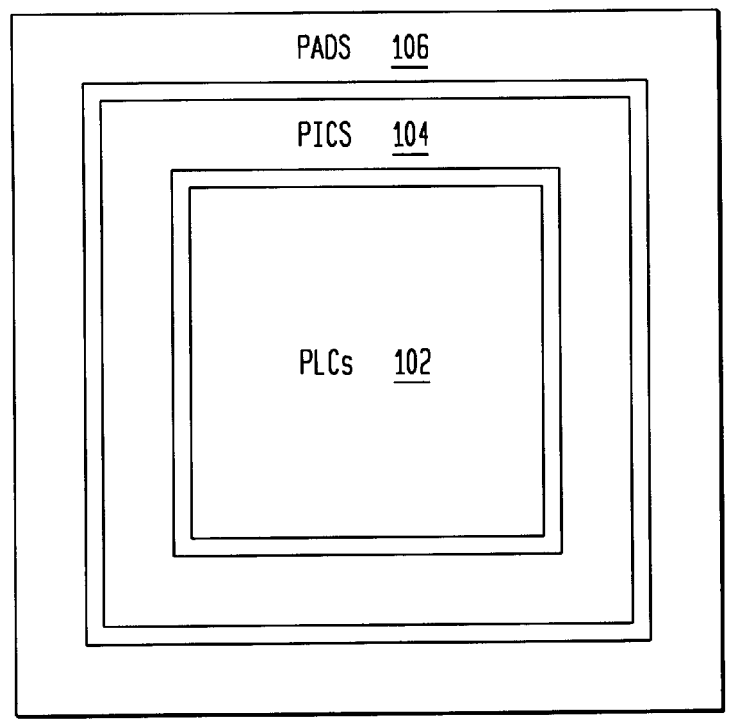
FIG. 1 shows a schematic diagram of a conventional FPGA.
Figure 3:
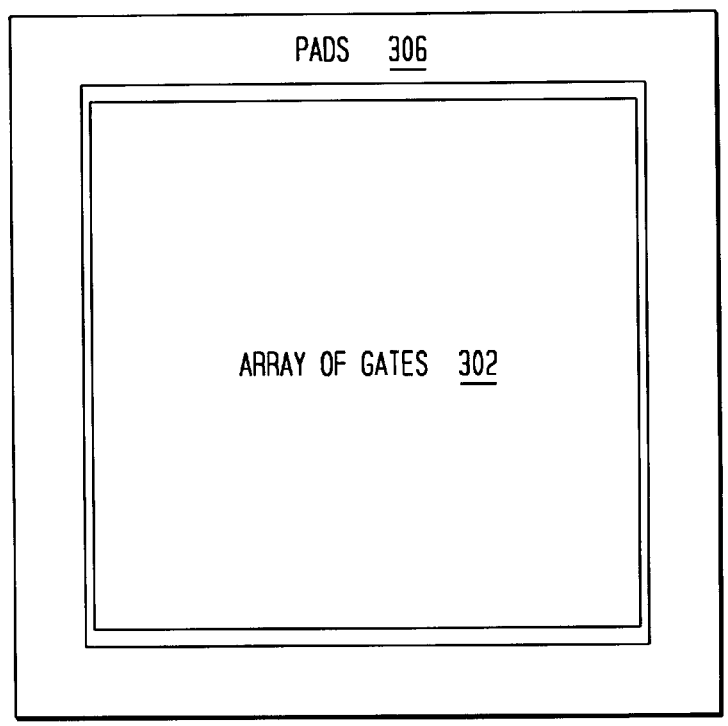
FIG. 3 shows a schematic diagram of a conventional MPGA.

Depending on the type or types of applications for which a conventional FPGA is to be used, there may be certain functions that many users will want to program into their FPGAs. Such functions may include anything that, in the past, has been placed in an MPD. According to the present invention, this permanent functionality can be implemented in MPD-type logic, while other user-specified functionality is implemented in FPGA-type logic, all on the same chip.

The present invention is directed to hybrid circuitry that combines one or more regions of FPGA-type logic with one or more regions of MPD-type logic on a single integrated circuit (IC) chip. By combining both FPGA- and MPD-type logic on one die, the advantages of both may be reaped. A specific logic function that requires high performance and/or needs to be very dense and/or is not possible in an FPGA (e.g., implementing an analog circuit with critical characteristics) can be implemented in MPD-type logic on a die with FPGA-type logic around it. The invention permits changes to functionality, when needed, yet provides improved performance and smaller device size over conventional FPGAs.

In particular, the regions of MPD-type logic may be pre-programmed in the factory to implement functions that, with conventional FPGAs, would be programmed in the field. The regions of FPGA-type logic are then left for the user to program in the field. In this way, a hybrid IC of the present invention combines the programming flexibility of FPGA-type logic with the size and speed advantages of MPD-type logic. As a result, the hybrid IC can have faster speed, smaller area, and lower dollar cost than conventional FPGAs which have only FPGA-type logic, without losing the flexibility of field programming that give FPGAs an advantage over conventional MPDs. This allows applications to be split into two categories of functions: permanent functions and user-specified functions. According to the present invention, permanent functions can be implemented in MPD-type logic for fast speed, small area, and low power usage, while the user-specified functions are implemented in FPGA-type logic.

FIG. 4 shows a schematic diagram of a hybrid integrated circuit 400, according to one embodiment of the present invention. Similar to conventional FPGA 100 of FIG. 1, hybrid IC 400 comprises an array 402 of programmable logic cells surrounded on three sides by a ring of programmable I/O cells 404 and an outermost ring of pads 406. On its fourth side, however, PLC array 402 is bounded by sets of FPGA-ASB interface hardware 412 that allow PLC array 402 to interface with an application specific block (ASB) 408, which is implemented using MPD-type logic. For purposes of this specification, each set of FPGA-ASB interface hardware is referred to as an ASB-interface cell (AIC).

In a preferred embodiment, the PICs and AICs are implemented using the same generic set of field-programmable logic and routing circuitry, which is programmed to function as either a PIC or an AIC. For purposes of this specification, this generic set of programmable logic and routing circuitry is referred to as a fast interface switch hierarchy (FISH) cell. Each FISH cell is preferably programmed in the factory to function either (1) as a PIC that forms an interface between PLC array 402 and the corresponding pads 406 or (2) as an AIC that forms interfaces between PLC array 402 and ASB 408.

A FISH cell can be programmed in the factory or in the field to function as a PIC or as an AIC. Even when programmed in the factory, there are other aspects of a programmed FISH cell that are still field programmable. That is, when factory-programmed to function as a PIC, a FISH cell has the same field programmability of a conventional PIC, such as those used in conventional FPGA 100 of FIG. 1. Similarly, when factory-programmed to function as an AIC, a FISH cell has other field programmable aspects.

Figure 5:
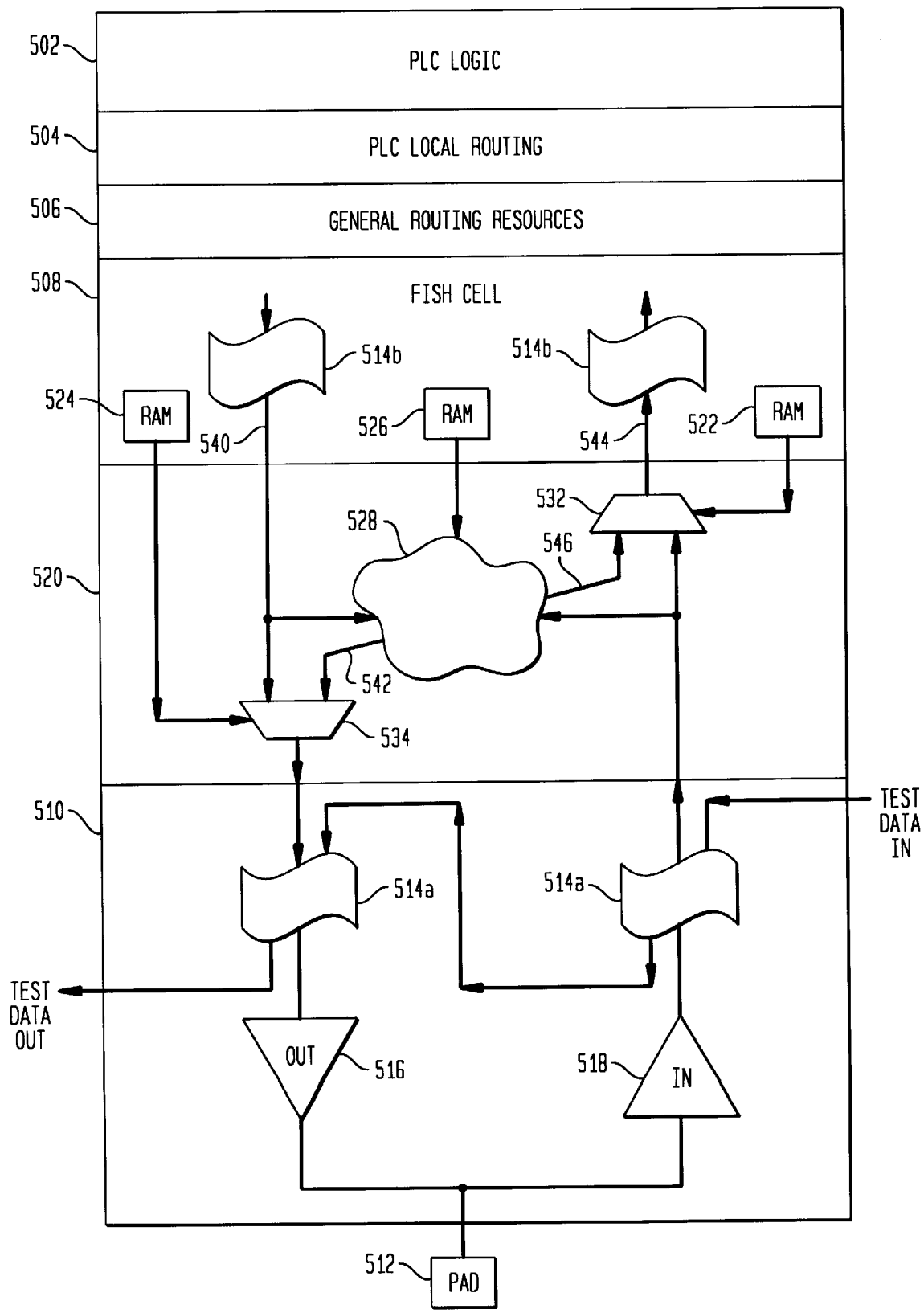
FIG. 5 shows a schematic diagram of the circuitry of the hybrid IC of FIG. 4 that is associated with one set of FISH-cell logic, according to one embodiment of the present invention.

FIG. 5 shows a schematic diagram of the circuitry of hybrid IC 400 of FIG. 4 that is associated with one set of FISH-cell logic, when operating as an AIC, according to one embodiment of the present invention. PLC logic 502 and PLC local routing 504 are part of PLC array 402 of FIG. 4. General routing resources 506 correspond to the programmable routing and logic used to connect individual sets of PLC logic to individual sets of FISH-cell logic and any other logic blocks. Pad 512, output buffer 516, and input buffer 518 are analogous to pad 212, output buffer 216, and input buffer 218 of FIG. 2, respectively. Also, the optional boundary scan and miscellaneous logic 214 of FIG. 2 is broken into logic 514a and 514b of FIG. 5.

Figure 2:
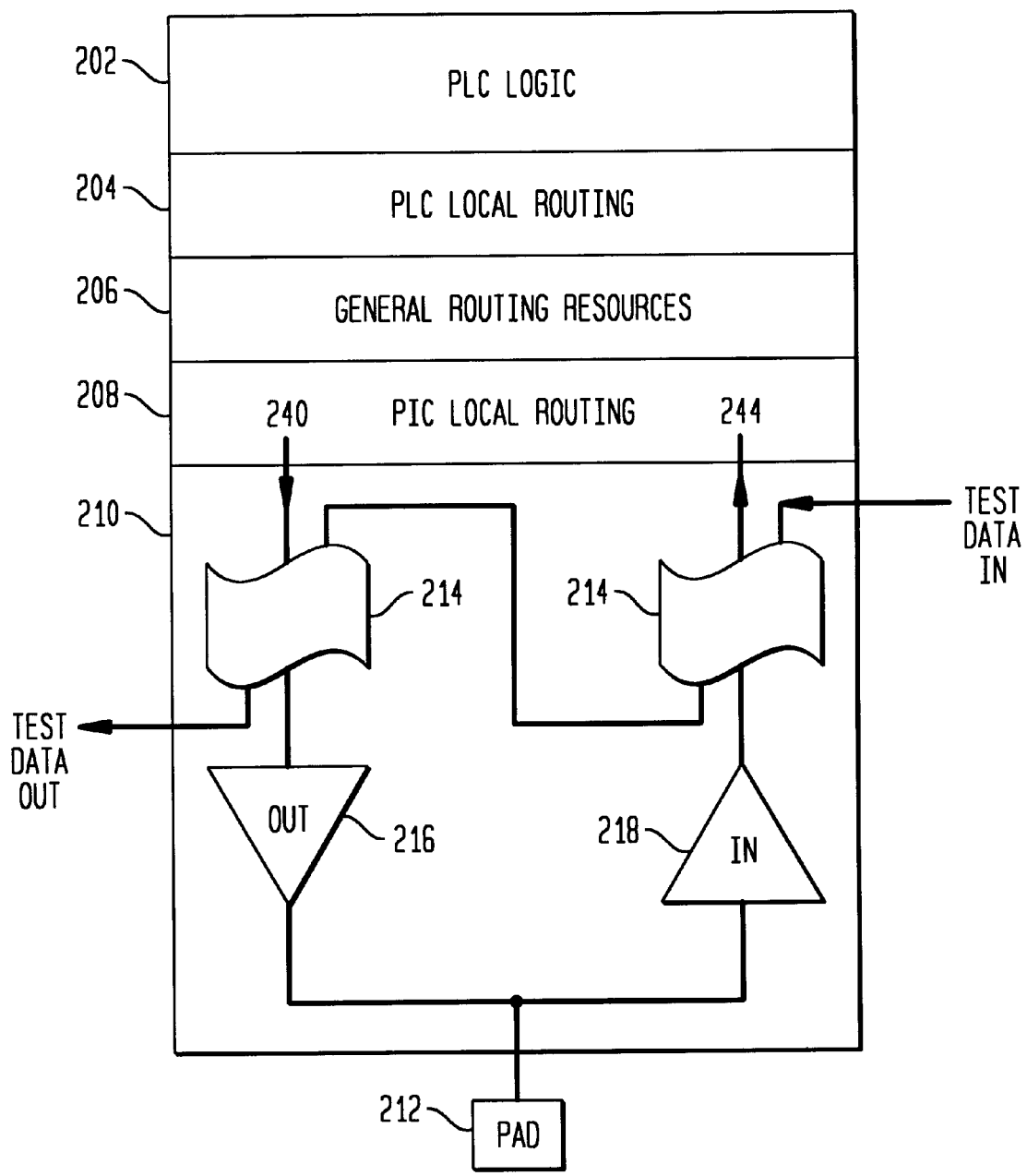
FIG. 2 shows a detail of a portion of the conventional FPGA of FIG. 1.

For this particular implementation, the FISH-cell of FIG. 5, according to the present invention, differs from the conventional PIC circuitry of FIG. 2 in a number of significant ways. First of all, the ASB block 520 includes mux 534, which is used to select between signal 540 from FISH cell 508 or signal 542 from ASB logic 528, to be sent to output buffer 516 through optional boundary scan block 514a. This selection can be set by configuration RAM cell 524 in FISH cell 508, whose output is tied to the control input of mux 534. Optionally, signal 540 from FISH cell 508 can also be sent to ASB logic 528. Another option would be to permanently tie the control lead to mux 534 at the factory, thus permanently selecting one of the signals to be sent to output buffer 516. In the same manner, signals from the input buffer 518 can be sent to ASB logic 528 and/or to FISH cell 508 after passing through optional boundary scan block 514a. Mux 532, whose control lead is driven by the output of RAM cell 522, is used to select either output signal 546 from ASB logic 528 or the signal from input buffer 518, to be sent to FISH cell 508 through signal 544. Optionally, the control lead to mux 532 could again be permanently tied.

Another significant difference between the FISH-cell circuitry of FIG. 5 and the conventional PIC circuitry of FIG. 2 is the addition of one or more extra programmable RAMs and/or other programming elements (526) within FISH cell 508. FISH cell 508 and ASB logic 528 can use these memory cells to provide a limited amount of flexibility in the ASB.

In order for the FISH-cell circuitry of FIG. 5 to function as a conventional PIC, muxes 532 and 534 may be programmed to provide direct connections between boundary scan logic 514a and other miscellaneous FISH-cell logic 514b. On the other hand, in order for the FISH-cell circuitry of FIG. 5 to function as an ASB-interface cell, muxes 532 and 534 may be programmed to provide (1) connections between PLC logic 502 and ASB logic 528, and (2) connections between ASB logic 528 and pad 512 via I/O logic 516 and 518.

As mentioned previously, each FISH cell is both mask programmable and field programmable. It is optionally mask programmable in the factory to allow certain connections that dictate whether or not the FISH cell will be interfacing to an ASB or I/O logic, that is, whether the FISH cell will function as an AIC or a PIC. Whether or not a FISH cell is programmed to interface to an ASB, in one preferred embodiment, the FISH cell still looks like a PIC at the edge of the PLC array, thereby keeping the PLC-PIC boundary consistent around the chip. This alleviates any software issues involved in placing an ASB within an FPGA, because the PLC-PIC array connections are essentially unchanged. Although the chip size may change when an ASB is incorporated on an FPGA, the PLC array itself will not have to have a different architectural model. Timing models will also remain the same for the PLC array with or without an ASB. The FISH cell may be mask programmed in the factory to adjust the load on certain global signal distribution networks so as to keep the timing models the same.

One advantage of using a single generic FISH-cell design of FIG. 5 for both the PICs and the AICs of a hybrid IC of the present invention is that the hybrid IC will work with existing FPGA software tools that are used for conventional FPGAs, such as FPGA 100 of FIG. 1. In an IC having only FPGA-type logic and no ASB, each FISH cell will be mask programmed to operate as a PIC. As such, the generic FISH cell of FIG. 5 can be used in any FPGA-related circuit—either those ICs having only FPGA-type logic or those hybrid ICs having both FPGA- and MPD-type logic.

Depending on the embodiment, the FPGA-type logic in a hybrid IC of the present invention may be implemented using any suitable type of field-programmable logic, such as SRAM-based, DRAM-based, fuse-programmable, anti-fuse-programmable, EPROM-based, or EEPROM-based gate-array logic. Similarly, the MPD-type logic may be implemented using any suitable type of mask-programmable logic, such as nMOS, pMOS, CMOS, GaAs, etc.

Programming of the FPGA-type logic is typically done through a configuration interface that reads a stream of bits and writes data into the configuration storage, which then controls the programmable logic and routing. Typically, this configuration interface can read this stream of data automatically from many external storage media, including serial PROMs, parallel PROMs, and by interfacing with a microprocessor. One embodiment of FIG. 4 allows ASB block 408 to interface with the configuration interface logic directly, thus allowing the ASB logic to write the configuration bits, as well as control the configuration process and receive the status of the configuration process.

In the embodiment of FIG. 4, hybrid IC 400 has one region of FPGA-type logic (i.e., PLC array 402) and one region of MPD-type logic (i.e., ASB 408). In general, the present invention can be implemented as a single IC having one or more regions of FPGA-type logic and one or more regions of MPD-type logic. Moreover, the type of logic used may differ from region to region. For example, a first region of FPGA-type logic may be implemented using SRAM-based gate-array logic, while a second region of FPGA-type logic of the same hybrid IC may be implemented using DRAM-based gate-array logic. Similarly, a hybrid IC of the present invention could have regions implemented using two different types of MPD-type logic.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A programmable logic device comprising:
   (a) an array of programmable logic cells (PLCs), each PLC comprising one or more programmable logic elements and programmable routing;
   (b) a set of device input/output (I/O) pads;
   (c) a set of programmable I/O cells (PICs), each PIC providing a programmable interface between the PLC array and a first subset of the I/O pads;
   (d) an application-specific block (ASB) comprising non-field-programmable mask-programmed logic; and
   (e) a set of programmable ASB-interface cells (AICs), wherein:
   each AIC provides a programmable interface between a first pin on the PLC array and the ASB; and
   at least one AIC provides one or more output values from one or more programming memory cells to the ASB for use in programmably selecting between different functionalities in the ASB during configuration of the programmable portion of the device.

2. The invention of claim 1, wherein each AIC also simultaneously provides:
   a programmable interface between the ASB and an I/O pad of a second subset of the I/O pads; and
   a programmable interface between a second pin on the PLC array and the I/O pad of the second subset of the I/O pads, wherein the ASB is bypassed by programmably connecting the second pin on the PLC array to the I/O pad of the second subset of the I/O pads.

3. The invention of claim 2, wherein the first and second pins on the PLC array are the same pin.

4. A programmable logic device comprising:
   (a) an array of PLCs, each PLC comprising one or more programmable logic elements and programmable routing;
   (b) a set of device I/O pads;
   (c) a set of PICs, each PIC providing a programmable interface between the PLC array and a first subset of the I/O pads;
   (d) an ASB comprising non-field-programmable mask-programmed logic; and
   (e) a set of programmable AICs, wherein:
   each AIC provides a programmable interface between a first pin on the PLC array and the ASB; and
   at least one AIC provides an interface from the ASB to programming logic of the programmable portion of the device that allows the ASB to write to programming memory or read back the programming memory contents that are used to configure the programmable portion of the device.

5. The invention of claim 4, wherein each AIC also simultaneously provides:
   a programmable interface between the ASB and an I/O pad of a second subset of the I/O pads; and
   a programmable interface between a second pin on the PLC array and the I/O pad of the second subset of the I/O pads, wherein the ASB is bypassed by programmably connecting the second pin on the PLC array to the I/O pad of the second subset of the I/O pads.

6. The invention of claim 5, wherein the first and second pins on the PLC array are the same pin.

7. The invention of claim 6, wherein the ASB provides programming control signals through one or more AICs to control a programming process in the programmable portion of the device.

8. The invention of claim 7, wherein the ASB reads programming status signals through one or more AICs from a programming process in the programmable portion of the device.

9. A programmable logic device comprising:
   (a) an array of PLCs, each PLC comprising one or more programmable logic elements and programmable routing;
   (b) a set of device I/O pads;
   (c) a set of PICs, each PIC providing a programmable interface between the PLC array and a first subset of the I/O pads;
   (d) an ASB comprising non-field-programmable mask-programmed logic; and (e) a set of AICs, wherein each AIC simultaneously provides:
  (i) a programmable interface between a first pin on the PLC array and the ASB;
  (ii) a programmable interface between the ASB and an I/O pad of a second subset of the I/O pads; and
  (iii) a programmable interface between a second pin on the PLC array and the I/O pad of the second subset of the I/O pads, wherein the ASB is bypassed by programmably connecting the second pin on the PLC array to the I/O pad of the second subset of I/O pads.

10. The invention of claim 9, wherein the first and second pins on the PLC array are the same pin.

* * * * *